United States Patent [19]
Okuyama

[11] 4,291,268
[45] Sep. 22, 1981

[54] APPARATUS FOR DRIVING A DEFLECTING COIL TYPE METER

[75] Inventor: Hideo Okuyama, Omiya, Japan
[73] Assignee: Kanto Seiki Company, Limited, Omiya, Japan
[21] Appl. No.: 88,129
[22] Filed: Oct. 25, 1979
[30] Foreign Application Priority Data
  Oct. 27, 1978 [JP] Japan .................. 53-148056[U]
[51] Int. Cl.³ .................. G01R 19/00; G01R 7/08
[52] U.S. Cl. .................. 324/76 R; 324/146; 324/154 R; 324/166
[58] Field of Search .................. 324/125, 160, 140 R, 324/166, 173, 175, 176, 169, 146, 76 R, 154 R; 307/10 R

[56] References Cited
U.S. PATENT DOCUMENTS
3,602,811  8/1971  Fales .................. 324/169
3,761,731  9/1973  Burgett et al. .................. 324/146

*Primary Examiner*—Ernest F. Karlsen
*Attorney, Agent, or Firm*—Lowe, King, Price & Becker

[57] ABSTRACT

A time-constant circuit is employed for gradually decreasing the voltage of an input signal carrying information to be indicated by a deflecting coil type meter so that the voltage of an input signal applied to the following driving stage does not abruptly drop to zero although the power switch of the driving circuit is turned off. A timer circuit responsive to the power switch energizes a relay or a switching circuit to supply the driving stage with electrical power not only for the time that the power switch is on but also for an additional interval after the power switch is turned off so that the driving stage is capable of being responsive to the gradually decreasing voltage causing the pointer of the meter to return to the zero point.

7 Claims, 6 Drawing Figures

APPARATUS FOR DRIVING A DEFLECTING COIL TYPE METER

FIELD OF THE INVENTION

This invention generally relates to electrical meters for indicating a variable. More particularly, the present invention relates to a driving circuit of a deflecting coil type meter or gauge.

BACKGROUND OF THE INVENTION

Conventional deflecting coil type meters have a drawback that the pointer or the indicator needle of the meter does not return to the zero point after measurement terminates. In such a conventional meter, when the power switch of the meter driving circuit is turned off, the input signal having information to be indicated by the pointer disappears or the meter driving circuit does not operate anymore so that the pointer of the meter remains at the same point as before.

Because of this particular characteristic of the conventional deflecting coil type meters, the operator or the user of the meter has to be careful whether the value indicated by the pointer is that represented by the input signal applied at the instant or that of the former state. In other words, the user of the meter might misunderstand the actual value of the input signal when he reads the indicated value without ascertaining whether the power switch of the driving circuit is turned off or not. For instance, assuming that such a conventional meter is installed in a motor vehicle to function as a tachometer, the pointer or the indicator needle continuously indicates a certain engine speed even though the power switch of the meter driving circuit is turned off. Therefore, the vehicle driver might misunderstand that the tachometer malfunctions. In order to eliminate such inconvenience it is desirable that the pointer of the meter always returns to the zero point on the calibrated dial plate whenever the power switch of the driving circuit is turned off.

SUMMARY OF THE INVENTION

The present invention has been developed in order to remove the above described inconvenience and disadvantages inherent to the conventional deflecting coil type meters.

It is, therefore, a primary object of the present invention to provide a novel and useful driving circuit of a deflecting coil type meter in which the pointer or indicator needle is reset to the zero point when the power switch of the driving circuit is turned off.

According to the present invention a time-constant circuit is employed for exponentially decreasing the voltage of an input signal when the power switch of the driving circuit is turned off. A driving stage which follows the time-constant circuit is powered not only for a period of time that the power switch is ON but also for a predetermined period of time after the power switch is turned off so that the driving stage is responsive to the exponentially descreasing voltage to produce resultant magnetic field by which a magnetic rotor of the meter returns to the original zero point. In order to energize the driving stage in the above manner a timer circuit responsive to the power switch is used. Furthermore, in order to exponentially lowering the voltage of the input signal a switching circuit which connects the input of the time-constant circuit to ground is used. This switching circuit is responsive to the power switch and may be a frequency to voltage converter when the deflecting coil type meter is directed to measure a variable represented by pulses such as that derived from the ignition circuit of an internal combustion engine.

BRIEF DESCRIPTION OF THE DRAWINGS

These and other objects and features of the instant invention will become readily apparent from the following detailed description of the preferred embodiment taken in conjunction with the accompanying drawings in which.

DETAILED DESCRIPTION OF THE PREFERRED EMBODIMENT

Figure 1:
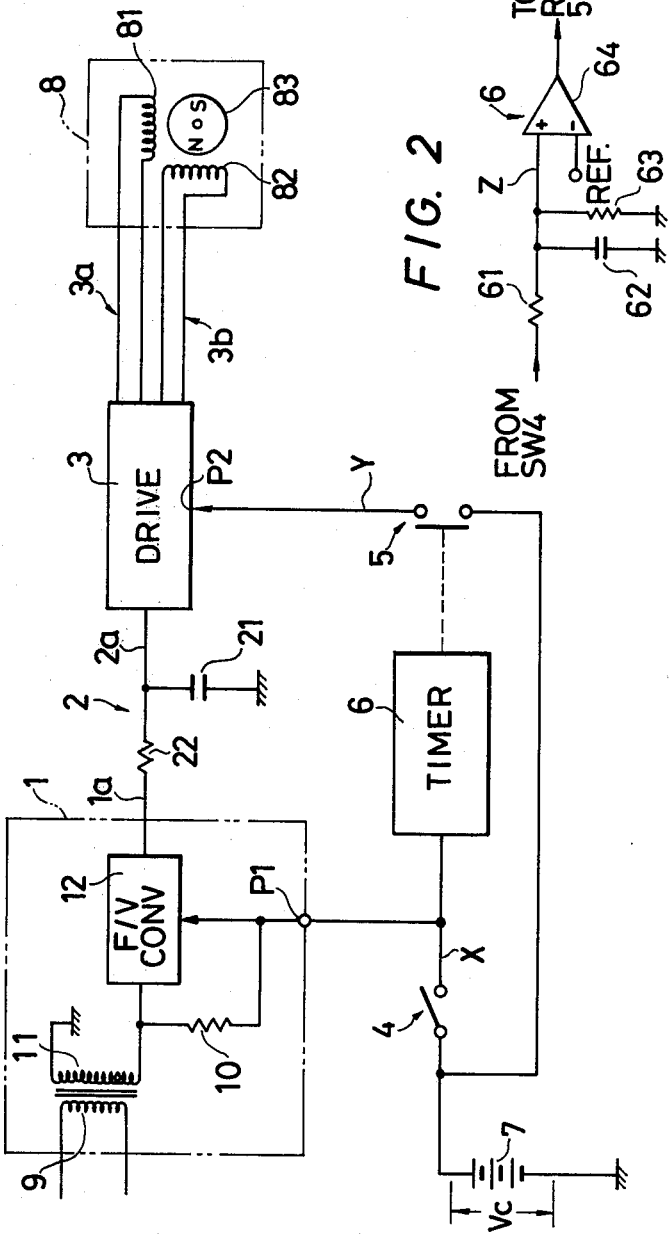
FIG. 1 is a schematic view illustrated partially in block form of an embodiment of the driving circuit of a deflecting coil type meter according to the present invention.

Referring to FIG. 1, a schematic block diagram of a preferred embodiment of the driving circuit of a deflecting coil type meter according to the present invention is shown. The driving circuit comprises an input stage 1, a time-constant circuit 2, a driving stage 3, a power circuit which includes a power switch 4, a relay 5 or a switching circuit, a timer circuit 6 and a power supply 7. A deflecting coil type meter 8 is also illustrated for a better understanding of the relationship between the driving circuit and the meter 8. Here, the words "deflecting coil type meter" mean an electrical meter for visually indicating a variable or condition by deflecting a magnetic rotor in accordance with the resultant magnitic field produced by at least two coils which are angularly positioned with respect to each other.

The arrangement of the input stage 1 may be changed in accordance with the sort of the input signal which is the objective of the measurement. Furthermore, if the input signal is of an analog signal, such an analog input signal may be directly applied to the time-constant circuit 2 as will be described hereinlater. In the preferred embodiment of the present invention, the driving circuit is adapted to be responsive to a pulse train signal the number of which per unit time is indicative of the rotational speed of the engine crankshaft. Such a pulse train signal may be derived from the ignition system of an engine. Therefore, the embodied deflecting coil type meter unit functions as a tachometer for visually indicating the engine rpm.

In order to produce an analog signal the voltage of which is representative of the engine crankshaft rotational speed, the input stage 1 comprises a transformer (no numeral), a F/V (frequency to voltage) converter 12, and a resistor 10. The transformer has a primary winding 9 and a secondary winding 11 for picking up pulse train signal from the ignition system of an engine. The primary winding 9 may be connected in series with the primary winding of the ignition coil (not illustrated) of the ignition system so that the primary winding 9 of the transformer receives a pulse each time the primary winding of the ignition coil is energized. Accordingly, pulses synchronous with the ignition pulses of the engine are transmitted to the secondary winding 11, while the voltage of the input pulses is suitably raised. The function of the transformer is not only to adjust the voltage of the pulses but also to function as a buffer circuit between the ignition system of the engine and the meter driving circuit. One end of the secondary winding 11 of the transformer is grounded, while the other end of the secondary winding 11 is connected to an input of the F/V converter 12 and is further connected to a power input terminal P1 via the resistor 10. The terminal P1 is provided for receiving electrical power from the power circuit and is further connected to the F/V converter 12 to supply the same with electrical power. The resistor 10 is used for providing the F/V converter input with a reference center voltage so that the voltage at the input of the F/V converter 12 varies in receipt of pulses from the secondary winding 11 with respect to the reference center voltage.

The output terminal of the F/V converter 12 is connected to the input of the time-constant circuit 2 which comprises a resistor 22 and a capacitor 21 and functions as a charg-discharge circuit. The resistor 22 is connected between the input and output terminals of the time-constant circuit 2, while the capacitor 21 is connected between the output terminal of the time-constant circuit 2 and ground. The time-constant of the time-constant circuit 2 may be changed by adjusting the resistance and the capacitance of the resistor 22 and the capacitor 21.

The output terminal of the time constant circuit, i.e. the junction connecting the resistor 22 and the capacitor 21, is connected to the input of the driving stage 3 which generates a pair of driving currents 3a and 3b in response to the output signal of the time-constant circuit 2. The driving currents 3a and 3b are respectively applied to first and second deflecting coils 81 and 82 of the meter 8. The deflecting coil type meter further comprises a rotatable round disk (rotor) 83 which is magnetized and is pivotally mounted so as to rotate (angularly displace) by means of the resultant magnetic field produced by the pair of coils 81 and 82. A suitable pointer or indicator needle (not illustrated) is mechanically connected via a shaft to the disk 83 so that the pointer visually indicates a value on a suitable dial plate in accordance with the rotational angle of the magnetic disk 83. The driving stage 3 and the deflecting coil type meter mechanism 8 may be any one of conventional devices. For instance, a meter driving stage and a deflecting coil type meter disclosed in U.S. Pat. No. 3,168,689 may be used. The driving stage 3 has a power input terminal P2 for receiving electrical power from the power circuit. It will be understood that the driving stage 3 generates the pair of driving currents 3a and 3b only when electrical power is applied to the power input terminal P2 thereof.

The power input terminals P1 and P2 of the input stage 1 and the driving stage 3 are respectively able to be connected to the power supply 7 in the following manner. The power supply 7, such as a battery, has a negative terminal connected to ground and a positive terminal connected to the movable contact of the power switch 4. The positive terminal of the power supply 7 is further connected to a first stationary contact of the relay 5 the operation of which is controlled by an output signal of the timer circuit 6. The power switch 4 has a stationary contact which is contactable with the movable contact, where the stationary contact is connected to the power input terminal P1 of the input stage 1 and the input of the timer circuit 6. The relay 5 has a movable contact, a second stationary contact connected to the power input terminal P2 of the driving stage 3 and the above mentioned first stationary contact. The movable contact of the relay 5 is arranged to bridge the first and second stationary contacts upon presence of the output signal of the timer circuit 6. The relationship between the timer circuit 6 and the relay 5 is shown by a dotted line. Although a relay is used for selectively supplying electrical power to the driving stage 3, a switching circuit of another type, such as a semiconductor switch may be used therefor.

Figure 2:
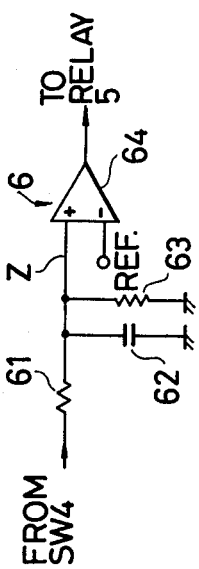
FIG. 2 is a circuit diagram of the timer circuit shown in FIG. 1.

FIG. 2 illustrates a detailed circuit diagram of the timer circuit 6. The timer circuit 6 comprises first and second resistors 61 and 63, a capacitor 62, and a comparator 64. The input of the timer circuit 6, which is connected to the stationary contact of the power switch 4, is connected via the first resistor 61 to a noninverting input (+) of the comparator 64, while an inverting input (−) of the comparator 64 is connected to a suitable reference voltage source. The second resistor 63 and the capacitor 62 constitute a parallel circuit and this parallel circuit is interposed between the noninverting input (+) of the comparator 64 and ground. The output of the comparator 64 is connected to the winding (not shown) of the relay 5. The resistance of the first resistor 61 is considerably smaller than that of the second resistor 63.

Figure 3:
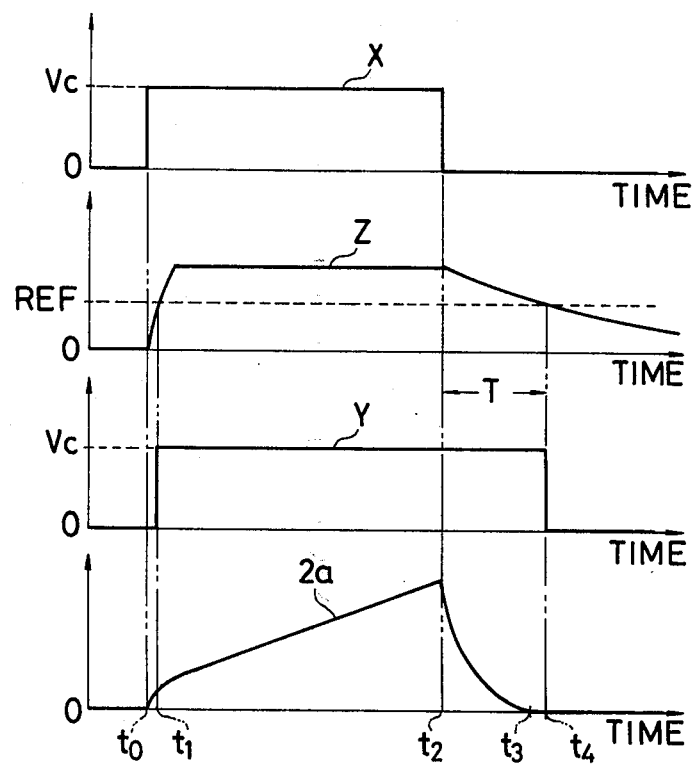
FIG. 3 is a time chart showing various voltages in the driving circuit shown in FIG. 1.

Now the operation of the driving circuit of FIG. 1 will be described with reference to a time chart of FIG. 3. Let us assume that the power switch 4 is turned on so that electrical power from the power supply 7 is applied via the power switch 4 and the power input terminal P1 of the input stage 1 to the F/V converter 12 for energizing the same. The voltages at the power input terminals P1 and P2 are respectively referenced by X and Y, while the voltage at the noninverting input (+) of the comparator 64 and the voltage at the output terminal of the time-constant circuit 2 are respectively referenced by Z and 2a in FIG. 1, FIG. 2 and FIG. 3. As shown by the first waveform in the time chart, the voltage at the power input terminal P1 rises to the voltage $V_c$ of the power supply 7 at time $t_0$ and falls to zero at time $t_2$ since the power switch 4 is turned on and turned off at time $t_0$ and time $t_2$ respectively.

The voltage $V_c$ transmitted through the power switch 4 is applied to the capacitor 62 via the resistor 61 both included in the timer circuit 6 (FIG. 2). The capacitor 62 is rapidly charged so that the voltage across the capacitor 62 increases exponentially as illustrated by the waveform of the voltage Z. The reference voltage applied to the inverting input (−) of the comparator is somewhat lower than the voltage $V_c$ of the power supply 7 so that the comparator 64 produces an output signal at time $t_1$. In other words, the comparator 64 delivers its output signal when the voltage at the noninverting input (+) exceeds the reference voltage which is predetermined. Upon presence of the output signal of the timer circuit 6, i.e. the output signal of the comparator 64, the winding of the relay 5 is energized so that the movable contact of the relay 5 electrically connects the stationary contacts thereof supplying the driving stage 3 with electrical power from the power supply 7 from time $t_1$ as illustrated by the waveform of the voltage Y.

It will be understood, therefore, that the driving stage 3 functions normally from time $t_1$, as long as the power switch 4 is maintained closed. Under conditions that the primary winding 9 of the transformer is connected to the primary winding of the ignition coil of the ignition system of an engine, a train of pulses is applied to the input of the F/V converter 12 so that the F/V converter 12 produces an analog output signal 1a indicative of the engine rpm. The output signal 1a of the F/V converter 12 is applied to the time-constant circuit 2 in which the analog signal 1a is integrated or smoothed so that the time-constant circuit 2 produces an output signal 2a the magnitude of which substantially corresponds to that of the input signal 1a thereof. In FIG. 3, the voltage of the output signal 2a of the time-constant circuit 2 is shown to be increasing from time $t_0$ as the engine rpm increases. The driving stage 3 is capable of being responsive to the output signal 2a of the time-constant circuit 2 from time $t_1$ since the driving stage 3 is energized from time $t_1$ as described hereinabove. The time difference between time $t_0$ and $t_1$ is negligibly small since the resistance of the resistor 61 of the timer 6 is small causing the capacitor 62 to be charged up rapidly. Namely, the driving stage 3 is energized immediately after the power switch 4 is turned on. The driving stage 3, therefore, produces its two output driving currents 3a and 3b in accordance with the magnitude of the output signal 2a of the time-constant circuit 2. The driving currents 3a and 3b from the driving stage 3 are respectively applied to the first and second deflecting coils 81 and 82 of the meter mechanism 8 so that the magnetic disk 83 rotates in a predetermined direction until the magnetic field made by the magnet of the disk 83 equilibrate with the resultant magnetic field produced by the deflecting coils 81 and 82. As the voltage 2a of the output signal of the time-constant circuit 2 rises as illustrated in FIG. 3, the pointer connected to the magnetic disk or rotor 83 continuously rotates indicating the increase in the engine rpm so that the user or the operator of the meter can visually ascertain the engine rpm by watching the pointer which rotates along the calibrated dial scale.

It is then assumed that the operator or the user of the meter intends to terminate the measurement at time $t_2$. The operator, who may be a motor vehicle driver if the meter is installed in a motor vehicle, turns off the power switch 4 at time $t_2$ so that the F/V converter 12 of the input stage 1 is deenergized. Accordingly, the voltage of the output signal 1a of the F/V converter 12 suddenly drops to zero. However, because of the time constant the voltage of the output signal 2a of the time-constant circuit 2 varies as indicated by the waveform thereof in FIG. 3. In detail, when the power switch 4 is turned off, the output terminal of the F/V converter 12 is substantially grounded so that carge prestored in the capacitor 21 of the time-constant circuit 2 starts discharging through the resistor 22. Namely, the voltage of the time-constant circuit output signal 2a does not abruptly drop to zero at time $t_2$, but exponentially decreases so that the voltage reaches zero at time $t_3$ which follows time $t_2$.

On the other hand, when the voltage from the power supply 7 disappears at time $t_2$, no current flows via the resistor 61 to the capacitor 62 so that the capacitor 62 is not charged anymore. The charge prestored in the capacitor 62 starts discharging via the resistor 63 which is connected in parallel with the capacitor 62 so that the voltage z across the capacitor 62 exponentially decreases as illustrated in the time chart. The resistance of the resistor 63 is relatively large compared to that of the resistor 61, so that it takes a certain period of time for the voltage Z across the capacitor 62 to be below the reference voltage. The voltage Z at the noninverting input (+) of the comparator falls below the reference voltage at time $t_4$ so that the output signal of the comparator 64 disappears accordingly from time $t_4$. This means that the winding of the relay 5 is deenergized at time $t_4$ so that the driving stage 3 is not supplied with electrical power after time $t_4$. Therefore, the driving stage 3 is able to normally operate for a period of time defined by $t_1$ and $t_4$ even though the power switch 4 is turned off at time $t_2$.

As described hereinabove, since the voltage of the output signal 2a of the time-constant circuit 2 gradually (exponentially) decreases from time $t_2$, the magnetic disk 83 as well as the pointer rotates in a direction that the pointer approaches the zero point of the dial plate. The pointer has to return to the zero point before time $t_4$ since after time $t_4$ the driving stage 3 is deenergized and thus no driving signal will be applied to the deflecting coils 81 and 82 resulting in half of the pointer at a point in front of the zero point. In order that the pointer necessarily returns to the zero point, an interval T between $t_2$ and $t_4$, for which the relay 5 is ON after opening of the power switch 4, has to be longer than a period of time required for the pointer to return to the zero point. Therefore, the interval T is determined by adjusting the resistance of the resistor 63 and/or the capacitance of the capacitor 62 such that the interval T is longer than the possible maximum period of time required for the pointer to return to the zero point. It is preferable that the pointer returns to the zero point as soon as possible after the power switch 4 is turned off. However, because of the friction between the shaft of the rotary magnetic disk 83 and the bearings incorporated with the shaft and the inertia of the disk 83 the rotary disk 83 cannot rotate if the resultant magnetic field produced by the deflecting coils 81 and 82 rotates at a speed higher than a given value, which may be referred to as the maximum limit, which is determined by the friction and the inertia. In other words, the disk 83 is able to follow the resultant magnetic field only when the resultant magnetic field rotates at a speed lower than the maximum limit. Therefore, the time constant of the time-constant circuit 2 has to be determined such that the resultant magnetic field rotates at a speed which is equal to the maximum limit or below.

Figure 4:
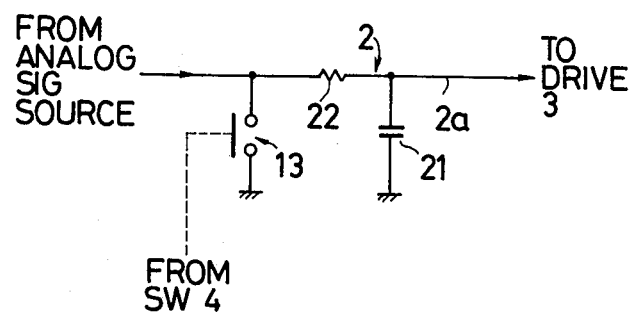
FIG. 4 is a diagram of an alternative modified arrangement that can be substituted in the circuit of FIG. 1.

Reference is now made to FIG. 4 which shows an alternative modified arrangement that can be substituted in the circuit of FIG. 1. This arrangement is used to receive an analog signal the magnitude of which is representative of a variable to be indicated by the meter 8. The input terminal of the time-constant circuit 2 is used to receive an input analog signal, while the same input terminal is connected via a switching circuit 13, such as a relay, to ground. The switching circuit 13 is controlled by the voltage X in FIG. 1. It will be understood that an input stage 1, which includes a transformer and a F/V converter, of FIG. 1 is not necessary. The switching circuit 13 is arranged to be OFF when the power switch 4 is closed so that an input signal is applied to the resistor 22 of the time-constant circuit 2 during the time that the power switch 4 is ON. As the power switch 4 is opened, the switching circuit 13 simultaneously becomes ON connecting the input of the time-constant circuit 2 to ground. Accordingly, the charge prestored in the capacitor 21 initiates discharging through the resistor 22 and the switching circuit 13. Therefore, the voltage across the capacitor 21 varies in the same manner as illustrated in FIG. 3.

Figure 5:
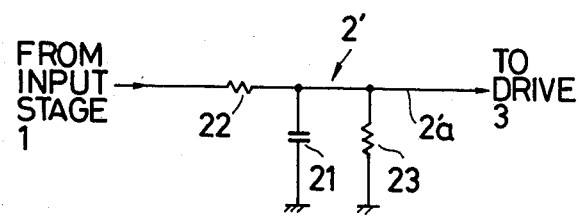
FIG. 5 is a diagram of another alternative modified arrangement that can be substituted in the circuit of FIG. 1.
Figure 6:
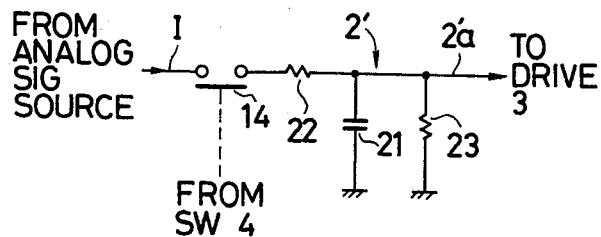
FIG. 6 is a diagram of a modified arrangement of FIG. 5.

FIG. 5 illustrates another modified arrangement which also can be substituted in the circuit of FIG. 1. The arrangement of FIG. 5 includes a time-constant circuit 2' which is similar to that of FIG. 1. The time-constant circuit 2' has an additional resistor 23 which is connected to the capacitor 21 in parallel. The resistances of the resistor 22 and the additional resistor 23 are determined such that the resistance of the additional resistor 23 is much larger than that of the resistor 22. With this arrangement the capacitor 21 is charged with a relatively short period of time since the charging current flows through the resistor 22, while the charge prestored in the capacitor 21 is discharged with a relatively long period of time since the charge of the capacitor 21 discharges via the additional resistor 23. In order that the charge of the capacitor 21 discharges only through the additional resistor 23, the input of the time-constant circuit 2' has to be insulated from ground so that the charge of the capacitor 21 does not rapidly flow through the resistor 22. Therefore, the former stage such as the input stage 1 of FIG. 1 has to be constructed such that the output terminal of the F/V converter 12 is not substantially grounded when the power switch 4 is turned off. If such an input stage is omitted for receiving an analog signal as described hereinabove, a suitable switching circuit 14 is connected in series with the signal input line I as illustrated in FIG. 6 for disconnecting the input terminal of the time-constant circuit 2' from the signal source at the time the power switch 4 is turned off. It will be understood that according to the arrangement of FIG. 5 or FIG. 6, the voltage of the output signal 2a of the time-constant circuit 2' rises quickly since the resistance of the resistor 22 is small so that the pointer of the meter 8 promptly indicates a right value in accordance with the information carried by the input signal.

The above described embodiment and the modified arrangements thereof are examples for the description of the present invention. Thus many modifications and variations will be obvious for those skilled in the art. For instance, the time-constant circuit 2 or 2' may comprise a suitable operational amplifier, and the timer circuit 6 may be constructed of a monostable multivibrator and an OR gate.

What is claimed is:

1. Apparatus for driving a deflecting coil type meter having a pair of coil windings angularly positioned with respect to each other, a magnetic rotor pivotally mounted so as to rotate under the influence of the resultant magnetic field produced by said coil windings, a pointer mechanically connected to said magnetic rotor and having an initial position, and a calibrated dial scale to which deflection of said pointer can be referred, which apparatus comprising:
   (a) a power switch connected to a power supply;
   (b) means for gradually decreasing the voltage of an input signal when said power switch is turned off, said input signal carrying information to be indicated by said meter, so that said coil windings receive said gradually decreasing input signal after said power switch is turned off;
   (c) a driving stage responsive to the output signal of said means, for producing driving currents which are applied to said coil windings;
   (d) a timer circuit responsive to the voltage applied through said power switch for producing an output signal during the time that said power switch is on and for a predetermined interval after said power switch is turned off; and
   (e) switching means for supplying said driving stage with electrical power in accordance with said output signal of said timer circuit to rotate said magnetic rotor to cause said pointer to return to its initial position after said power switch is turned off.

2. Apparatus for driving a deflecting coil type meter having a pair of coil windings angularly positioned with respect to each other, a magnetic rotor pivotally mounted so as to rotate under the influence of the resultant magnetic field produced by said coil windings, a pointer mechanically connected to said magnetic rotor and having an initial position, and a calibrated dial scale to which deflection of said pointer can be referred, comprising:
   (a) a power switch for controlling the output of a power supply;
   (b) a time-constant circuit responsive to an input signal carrying information to be indicated by said meter;
   (c) first switching means for connecting the input of said time-constant circuit to ground when said power switch is turned off;
   (d) a driving stage responsive to the output signal of said time-constant circuit for producing driving currents which are applied to said coil windings;
   (e) a timer circuit responsive to the voltage applied through said power switch for producing an output signal during the time that said power switch is on and for a predetermined interval after said power switch is turned off; and
   (f) second switching means for supplying said driving stage with electrical power in accordance with said output signal of said timer circuit to rotate said magnetic rotor to cause said pointer to return to its initial position after said power switch is turned off.

3. Apparatus as claimed in claim 2, wherein said time-constant circuit comprises a resistor connected aross the input terminal and the output terminal of said time-constant circuit, and a capacitor interposed between the output terminal and ground.

4. Apparatus for driving a deflecting coil type meter having a pair of coil windings angularly positioned with respect to each other, a magnetic rotor pivotally mounted so as to rotate under the influence of the resultant magnetic field produced by said coil windings, a pointer mechanically connected to said magnetic rotor and having an initial position, and a calibrated dial scale to which deflection of said pointer can be referred, comprising:
   (a) a power switch for controlling an output of a power supply;
   (b) a time-constant circuit responsive to an input signal carrying information to be indicated by said meter;
   (c) first switching means for insulating the input of said time-constant circuit from the former stage thereof when said power switch is turned off;
   (d) a driving stage responsive to the output signal of said time-constant circuit for producing driving currents which are applied to said coil windings;

(e) a timer circuit responsive to the voltage applied through said power switch for producing an output signal during the time that said power switch is on and for a predetermined interval after said power switch is turned off; and (f) second switching means for supplying said driving stage with electrical power in accordance with said output signal of said timer circuit to rotate said magnetic rotor to cause said pointer to return to its initial position after said power switch is turned off.

5. Apparatus as claimed in claim 4, wherein said time-constant circuit comprises a first resistor connected across the input terminal and the output terminal of said time-constant circuit, a capacitor interposed between said output terminal and ground, and a second resistor connected in parallel with said capacitor, said second resistor having a smaller resistance than said first resistor.

6. Apparatus as claimed in any one of claims 1 to 5, wherein said timer circuit comprises a comparator, a third resistor interposed between the input of said timer circuit and one input of said comparator, a parallel circuit of a capacitor and a second resistor which parallel circuit is interposed between said input of said comparator and ground, and a reference voltage source connected to the other input of said comparator.

7. Apparatus as claimed in any one of claims 1 to 5, further comprising an input stage for producing a suitable analog signal in response to a pulse train signal carrying information to be indicated by said meter, said input stage including a frequency to voltage converter for producing said analog signal in accordance with the frequency of said pulse train signal, said frequency to voltage converter being powered through said power switch so that said frequency to voltage converter produces zero voltage when said power switch is turned off.

* * * * *